(12) United States Patent
Xin-LeBlanc

(10) Patent No.: US 7,423,494 B1
(45) Date of Patent: Sep. 9, 2008

(54) APPARATUS AND METHOD FOR A SPREAD-SPECTRUM OSCILLATOR FOR MAGNETIC SWITCHED POWER CONVERTERS

(75) Inventor: Jane Xin-LeBlanc, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 618 days.

(21) Appl. No.: 11/030,681

(22) Filed: Jan. 5, 2005

(51) Int. Cl.
*H03B 29/00* (2006.01)
*H02J 1/02* (2006.01)

(52) U.S. Cl. .............................. 331/78; 363/39; 363/41

(58) Field of Classification Search ................... 363/41, 363/39; 331/78
See application file for complete search history.

(56) References Cited

U.S. PATENT DOCUMENTS

| 5,488,627 | A | 1/1996 | Hardin et al. | |
|---|---|---|---|---|
| 5,631,920 | A | 5/1997 | Hardin | |
| 2004/0090802 | A1 * | 5/2004 | Pourseyed et al. | ............ 363/39 |

OTHER PUBLICATIONS

Hiroshi Sadamura et al., "Spread-Spectrum Clocking in Switching Regulators To Reduce EMI", IEEE, Asia-Pacific Conference, Aug. 6-8, 2002 pp. 141-144.
M. Kuisma, "Variable Frequency Swtiching in Power Supply EMI-Control: An Overview", IEEE AES Systems Magazine, Dec. 2003, pp. 19-22.
D.A. Stone et al., "Effect of Spread-Spectrum Modulation of Switched Mode Power Converter PWM Carrier Frequencies on Conducted EMI", Electronics Letters, May 11, 1995, vol. 31, No. 10, pp. 769-770.

* cited by examiner

*Primary Examiner*—Joseph Chang
(74) *Attorney, Agent, or Firm*—Darby & Darby P.C.; Matthew M. Gaffney

(57) ABSTRACT

A method and apparatus for a spread-spectrum oscillator for a switched power converter is provided. The spread-spectrum oscillator includes a current waveform generation circuit, a capacitor, a switch, and a comparator. The capacitor is arranged to receive an oscillator current to provide a ramp voltage. The comparator is arranged to compare the ramp voltage with a reference voltage to provide an oscillator voltage. Further, the switch is arranged to discharge the capacitor when the oscillator voltage is asserted. The current waveform generation is arranged to, if enabled, provide at least a portion of the oscillator current as a triangle wave, or other type of modulating waveform suitable for spread-spectrum. Accordingly, the oscillator voltage is a spread-spectrum signal.

21 Claims, 7 Drawing Sheets

APPARATUS AND METHOD FOR A SPREAD-SPECTRUM OSCILLATOR FOR MAGNETIC SWITCHED POWER CONVERTERS

FIELD OF THE INVENTION

The invention is related to oscillators, and in particular, to an apparatus and method for spread-spectrum clock oscillation for a switched power converter accomplished by modulating the oscillator current.

BACKGROUND OF THE INVENTION

Spread-spectrum is a useful technique for many applications, including spread-spectrum telecommunications and spread-spectrum clock generation in synchronous digital systems containing microprocessors.

Spread-spectrum telecommunication, accomplished by employing frequency hopping and the like, may be employed to reduce interference and noise, and to improve privacy in confidential communications.

Spread-spectrum clock generation may be employed to reduce electro-magnetic interference (EMI). A fixed-frequency clock may have a narrow frequency spectrum with a high peak frequency spectral density. However, with spread-spectrum clock generation, the clock signal frequency spectrum may be down-spread so that the energy of the clock signal is distributed over a wider frequency range, reducing that peak carrier frequency. This in turn may reduce EMI.

BRIEF DESCRIPTION OF THE DRAWINGS

Non-limiting and non-exhaustive embodiments of the present invention are described with reference to the following drawings, in which.

DETAILED DESCRIPTION

Figure 1:
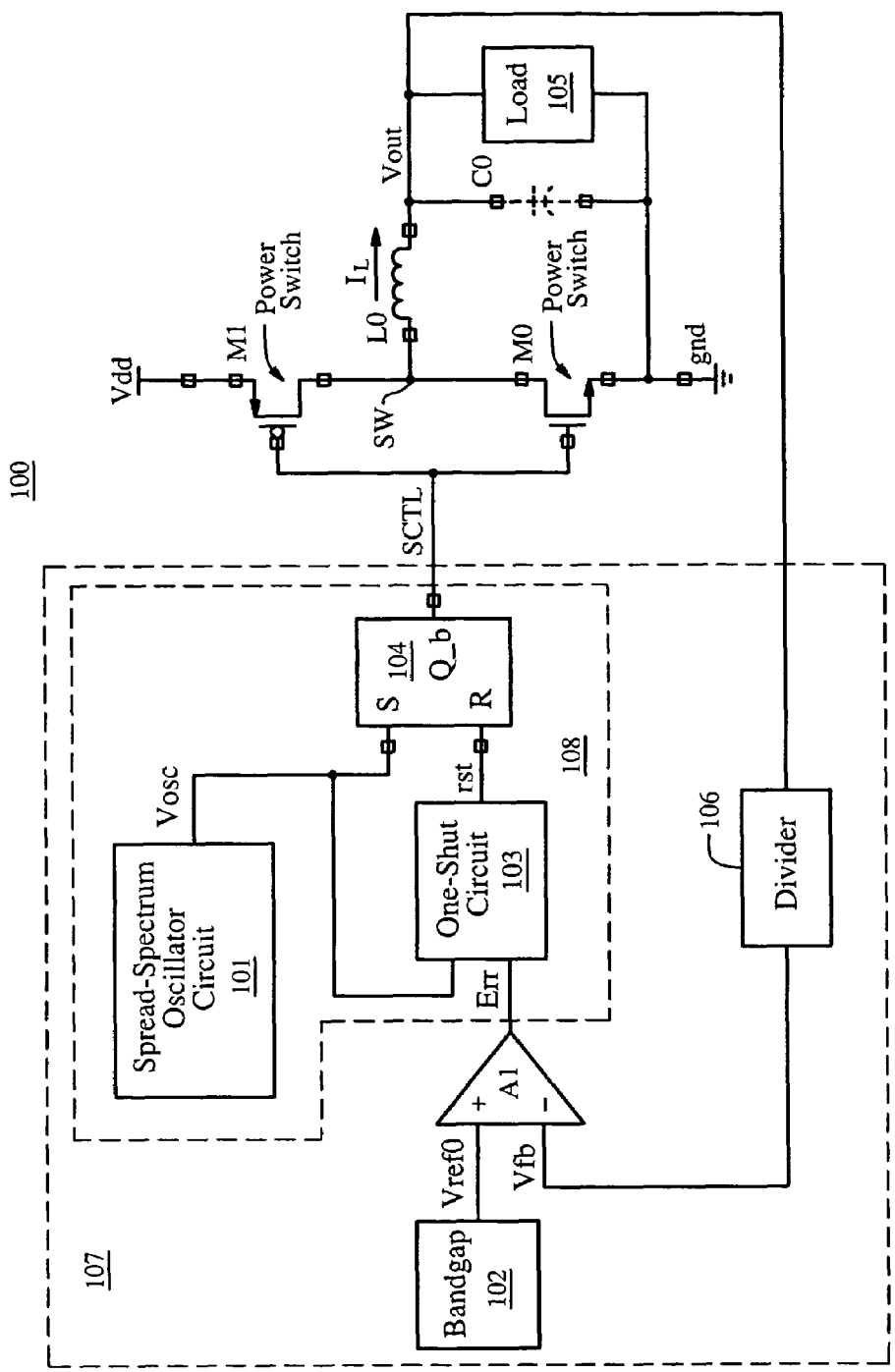
FIG. 1 illustrates a block diagram of an embodiment of a switched power converter.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set froth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a method and apparatus for a spread-spectrum oscillator for a switched power converter. The spread-spectrum oscillator includes a current waveform generation circuit, a capacitor, a switch, and a comparator. The capacitor is arranged to receive an oscillator current to provide a ramp voltage. The comparator is arranged to compare the ramp voltage with a reference voltage to provide an oscillator voltage. Further, the switch is arranged to discharge the capacitor when the oscillator voltage is asserted. The current waveform generation is arranged to, if enabled, provide at least a portion of the oscillator current as a triangle wave, or other type of modulating waveform suitable for spread-spectrum. Accordingly, the oscillator voltage is a spread-spectrum signal.

FIG. 1 illustrates a block diagram of an embodiment of switching converter 100. Switched converter 100 includes switched converter controller 107, transistors M1 and M0, inductor L0, capacitor C0, and load 105. Switched converter controller 107 includes bandgap reference circuit 102, error amplifier A1, voltage divider 106, and pulse width modulation (PWM) circuit 108. PWM circuit 108 includes spread-spectrum oscillator circuit 101. PWM circuit 108 may further include one-shot circuit 103 and SR latch 104.

Transistor M0 is arranged to operate as a synchronous switch. Transistor M1 is arranged to operate as a switch responsive to signal SCTL. Also, inductor L0 is arranged to provide inductor current $I_L$ responsive to the voltage across inductor L0. Output capacitor C0 is arranged to provide output voltage Vout responsive to current $I_L$. Additionally, load 105 is driven by voltage Vout.

Voltage divider 106 is arranged to provide feedback voltage vfb responsive to output voltage Vout. Further, bandgap reference circuit 102 is arranged to provide reference voltage vref0. Error amplifier A1 is arranged to provide error signal Err based on voltages vref0 and vfb. One-shot circuit 103 is arranged to perform a one-shot function on oscillator voltage Vosc to provide signal rst. Also, one-shot circuit 103 is arranged to provide signal rst such that the pulse is provided after a delay that is proportional to the voltage of error signal Err. SR latch 104 is arranged to provide switch control signal SCTL based on signals Vosc and rst.

Further, spread-spectrum oscillator circuit 101 is arranged to provide oscillator voltage Vosc based, in part, on an oscillator current (not shown in FIG. 1). At least a portion of the oscillator current is modulated such that voltage Vosc is a spread-spectrum signal.

In one embodiment, switch converter controller 107 is included in an integrated circuit, and the other elements of switched converter 100 are external to the integrated circuit. In other embodiments, additional components, such as transistors M1 and M2, may be included in the integrated circuit.

Although one embodiment of switching converter 100 is illustrated in FIG. 1, many other embodiments may be employed within the spirit and scope of the invention. For example, although a buck converter is shown in FIG. 1, a boost converter, a flyback converter, or the like, may be employed instead. Also, although a synchronous switch is illustrated in FIG. 1, a diode, or the like, may be employed for rectification rather than a synchronous switch. Additionally, although voltage mode regulation is shown in FIG. 1, current mode regulation, and the like, may be employed in addition to or in place of voltage mode regulation. These variations and other variations may be employed for switching converter 100 without departing from the scope and spirit of the invention.

Figure 2:
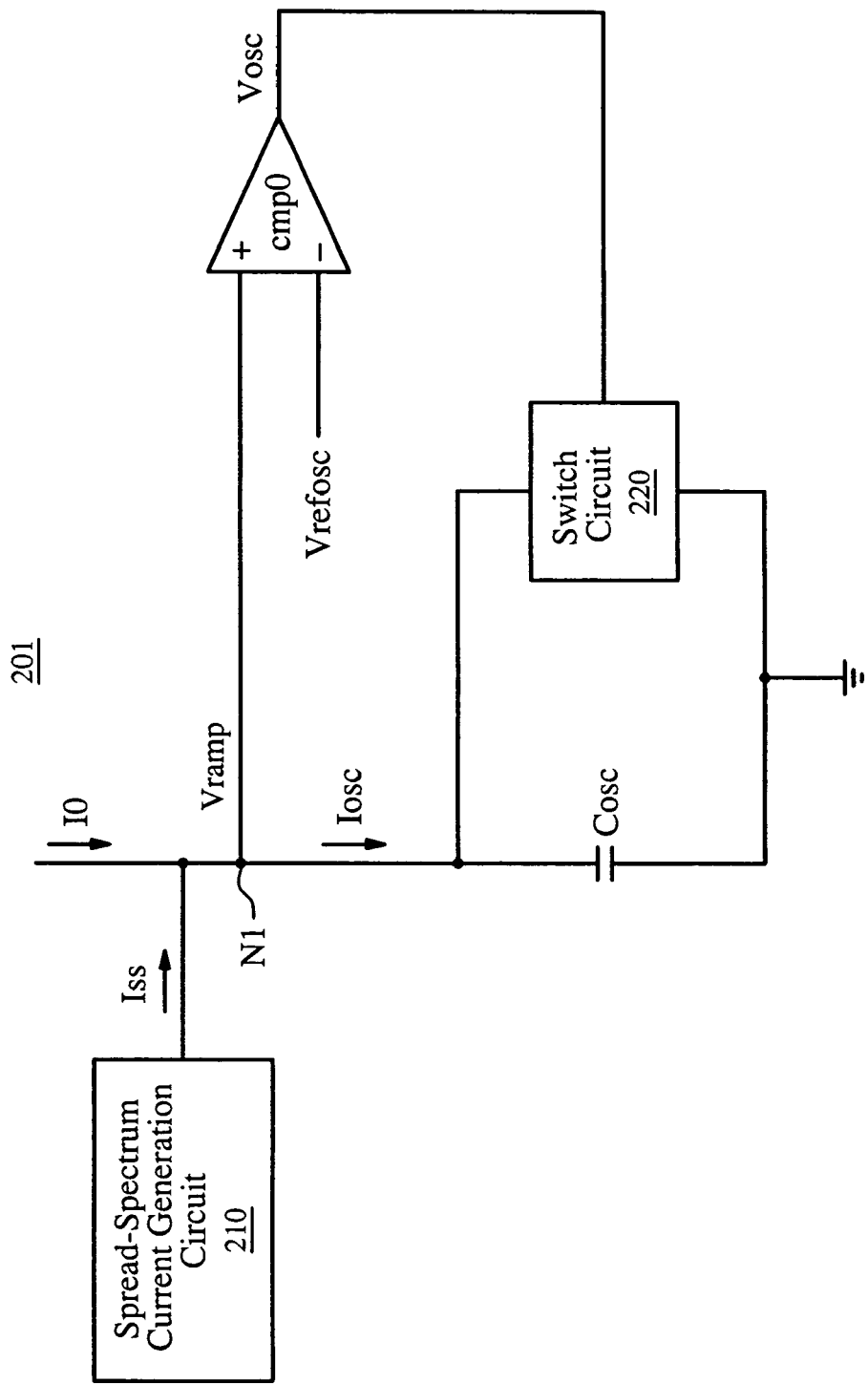
FIG. 2 shows a block diagram of an embodiment of a spread-spectrum oscillator circuit that may be employed an embodiment of the spread-spectrum oscillator circuit of FIG. 1.

FIG. 2 shows a block diagram of an embodiment of a spread-spectrum oscillator circuit 201. Spread-spectrum oscillator circuit 201 may be employed as an embodiment of spread-spectrum oscillator circuit 101 of FIG. 1. Also, spread-spectrum oscillator circuit 201 may be employed for other applications. Spread-spectrum oscillator circuit 201 includes spread-spectrum current generation circuit 210, comparator circuit cmp0, switch circuit 220, and capacitor circuit Cosc.

In operation, capacitor Cosc provides ramp voltage Vramp at node N1 based, in part, on current Iosc. Comparator circuit cmp0 is configured to compare ramp voltage Vramp with oscillator reference voltage Vrefosc, and to provide oscillator voltage Vosc based on the comparison. Also, switch circuit 220 is arranged to discharge capacitor circuit Cosc if voltage Vosc corresponds to an asserted level.

Current I0 may be provided by a reference current source, or the like. Spread-spectrum current $I_{SS}$ and current I0 are combined at node N1 to provide oscillator current Iosc. Accordingly, current Iosc may be substantially given by I0+Iss if spread-spectrum current generation circuit 210 is enabled.

Further, if spread-spectrum current generation circuit 210 is enabled, spread-spectrum current generator circuit 210 provides current $I_{SS}$ such that at least a portion of current $I_{SS}$ is modulated.

Figure 3:
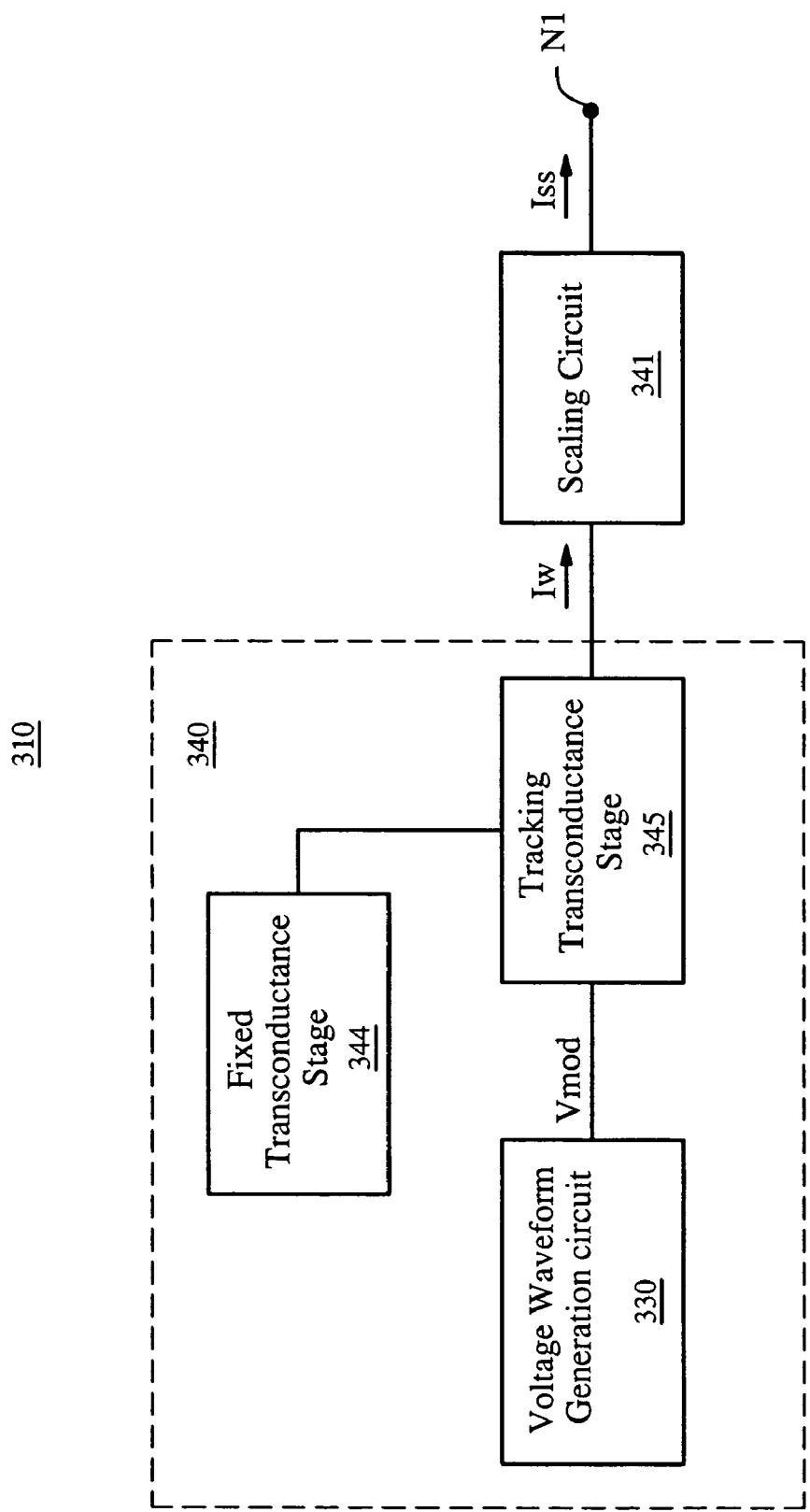
FIG. 3 illustrates a block diagram of an embodiment of the spread-spectrum current generation circuit of FIG. 2.

FIG. 3 illustrates a block diagram of an embodiment of spread-spectrum current generation circuit 310. Spread-spectrum current generation circuit 310 may be employed as an embodiment of spread-spectrum current generation circuit 210 of FIG. 2. Spread-spectrum current generation circuit 310 includes current waveform generator circuit 340 and scaling circuit 341. In one embodiment, current waveform generator 340 includes voltage waveform generator circuit 330, fixed transconductance stage 344, and tracking transconductance stage 345.

In operation, current waveform generation circuit 340 provides waveform current Iw such that current Iw varies over time as a waveform that is suitable for spread-spectrum modulation, such as a triangle wave.

In one embodiment, current Iw is provided as follows. Voltage waveform generation circuit 330 is arranged to provide modulating voltage Vmod. Modulating voltage Vmod varies over time as a waveform that is suitable for spread-spectrum modulation, such as a triangle wave. Also, fixed transconductance stage 344 is configured to have a substantially fixed transconductance (gm). Tracking transconductance stage 345 is arranged to provide current Iw based on voltage Vmod and a transconductance of the tracking transconductance stage. Further, tracking transconductance stage 345 is arranged such that the transconductance of tracking transconductance stage 345 is substantially the same as the transconductance of fixed transconductance stage 344.

Scaling circuit 341 is arranged to provide current $I_{SS}$ from current Iw. In one embodiment, scaling circuit 341 is arranged to provide current $I_{SS}$ by combining the current Iw with a bias current, and then scaling the combined current. In another embodiment, scaling circuit 341 is not included in spread-spectrum current generation circuit 310, and current $I_{SS}$ is current Iw.

Figure 4:
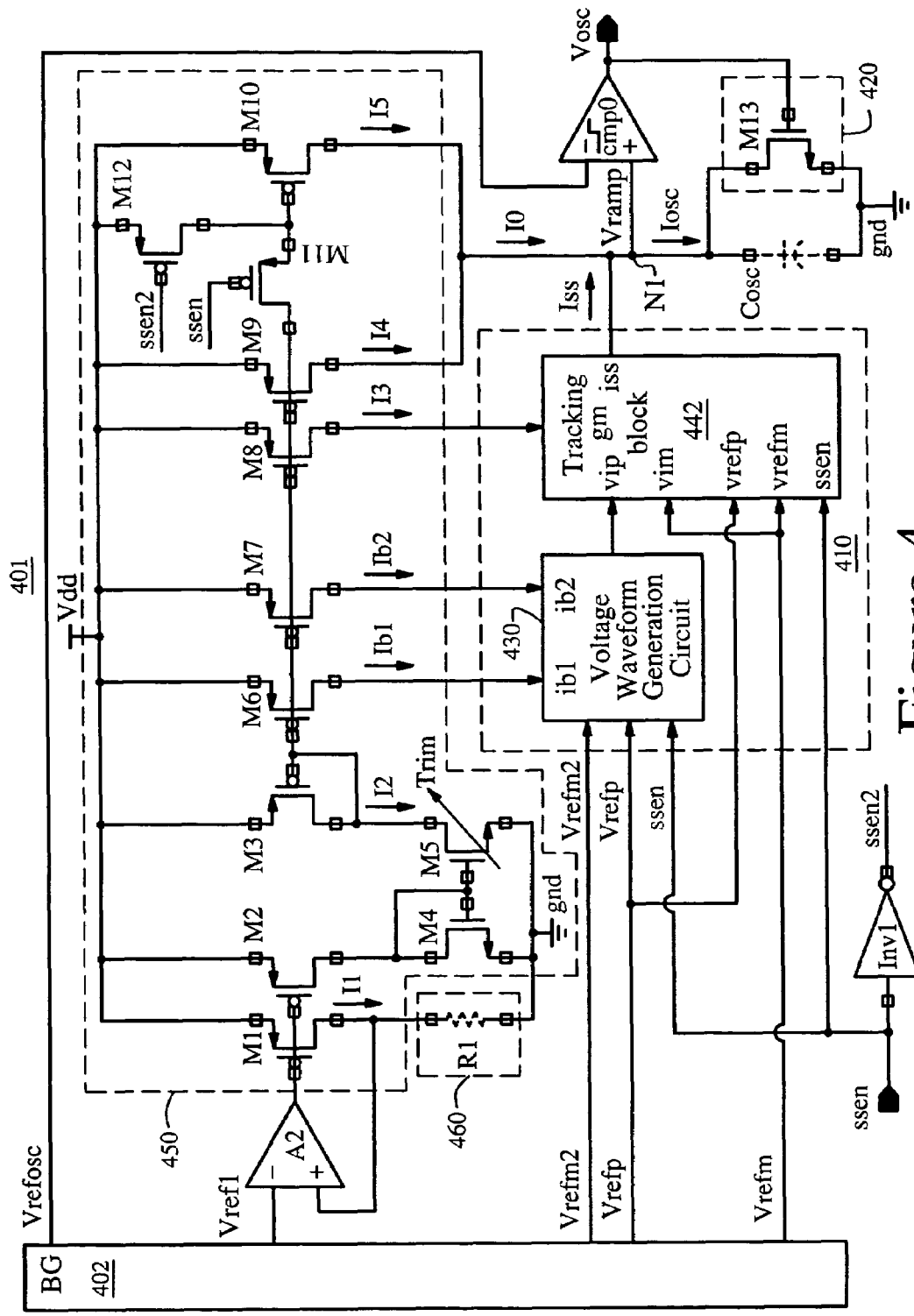
FIG. 4 shows a block diagram of another embodiment of the spread-spectrum oscillator circuit of FIG. 2.

FIG. 4 shows a block diagram of an embodiment of spread-spectrum oscillator circuit 401. Spread-spectrum oscillator circuit 401 may be employed as an embodiment of spread-spectrum oscillator circuit 201 of FIG. 2. Spread-spectrum oscillator circuit 401 further includes bandgap reference circuit 402, op amp A2, inverter Inv1, current mirror circuit 450, and impedance circuit 460. Impedance circuit 460 includes resistor R1. Also, current mirror circuit 450 includes transistors M1-M12. Spread-spectrum current generator circuit includes voltage waveform generator circuit 430 and tracking gm block 442. Additionally, switch circuit 420 includes transistor M13.

In operation, inverter Inv1 provides signal ssenz from spread spectrum enable signal ssen. If signal ssen is asserted, spread-spectrum current generation circuit 410 provides current $I_{SS}$, and current I5 is substantially zero. If signal ssen is unasserted, current $I_{SS}$ is substantially zero, and current I5 is provided based on the ratio of transistor M3 to transistor M10.

Also, op amp A2 is arranged to receive reference voltage vref1 at its inverting input, further arranged such that the voltage at the non-inverting input is substantially equal to Vref. Resistor R1 is arranged to provide input mirror current I1 such that current I1 is substantially given by vref1/R1. Additionally, current mirror circuit 450 is arranged to receive current I1; and to provide currents I0, I2-I5, Ib1, and Ib2 based, in part, on current I1. Transistor M5 may be trimmed to substantially correct for process variations. Current I2 is substantially given by k*I1, or k*(vref/R1).

In one embodiment, transistors M3, M6, M7, M8, M9, and M10 respectively have a ratio of approximately 1:0.005:0.005:0.05:0.95:0.5. In this embodiment, I4 is substantially 95% of current I2. If signal ssen is unasserted, current I4 is 95% of I2, I5 is substantially 5% of current I4, and current ISS is zero, so that oscillator current Iosc is substantially equal to 100% of current I4. If signal ssen is asserted, current I4 is 95% of current I2, current I5 is zero, and current $I_{SS}$ is, in one embodiment, a triangle wave that varies from 3.75% of I2 to 6.25% of I2, so that oscillator current Iosc varies from 98.75% of current I2 to 101.25% of I2.

Frequency Fosc of voltage Vosc may be substantially given by Fosc=Iosc/(Cosc*Vrefosc). If signal ssen is unasserted, then Fosc may be substantially given by Fosc=k*Vref1/(R1*Cramp*Vrefosc). If signal ssen is asserted, Fosc is modulated by modulating Iosc.

Figure 5:
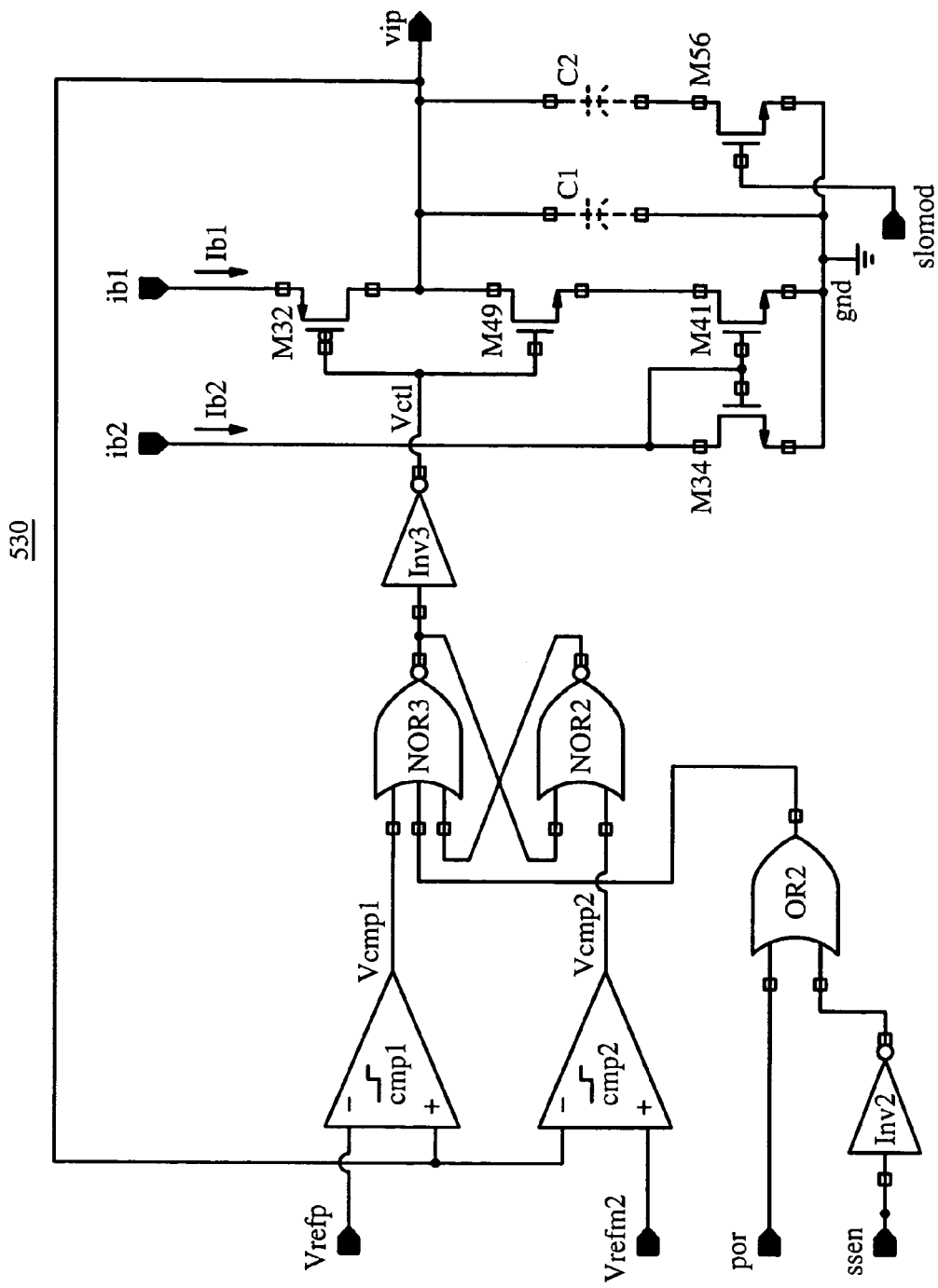
FIG. 5 illustrates a block diagram of an embodiment of the voltage waveform generation circuit of FIG. 4.

FIG. 5 illustrates a block diagram of an embodiment of the voltage waveform generation circuit 530, which may be employed as an embodiment of voltage waveform generator circuit 430 of FIG. 4.

Transistors M34 and M41 are arranged as a current mirror. In one embodiment, current mirror M34/M41 is a 1-to-1 current mirror. Transistors M32 and M49 are arranged to operate as an inverter/switch. Voltage vip is an embodiment of modulating voltage Vmod of FIG. 3. If voltage vctl is logic high, transistor M49 is on, transistor M32 is off, and modulating voltage vip is slowly discharged by current source transistor M41. If voltage vctl is logic low, transistor M49 is off, transistor M32 is on, and voltage vip is charged up by current Ib1.

Figure 6:
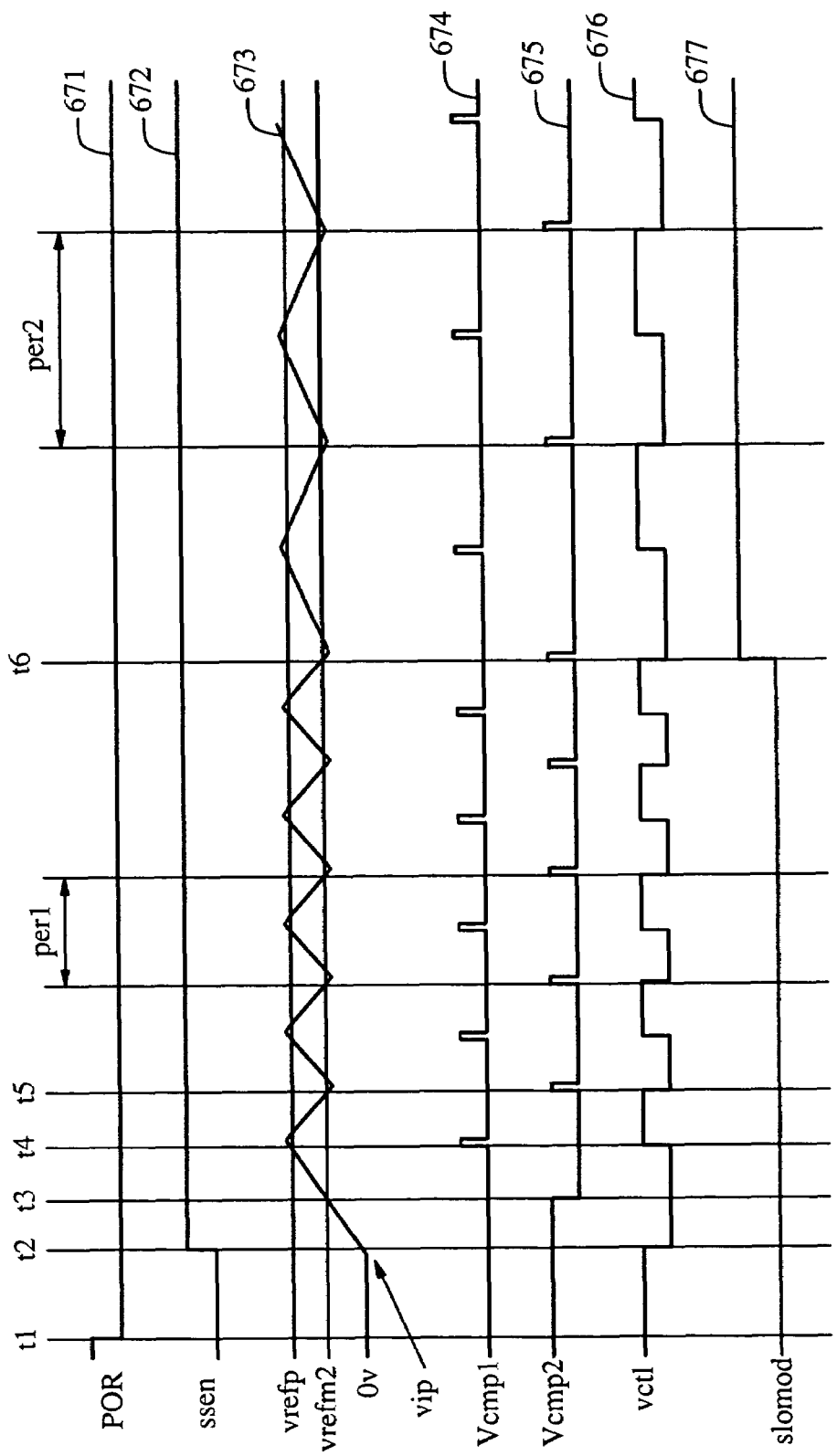
FIG. 6 shows a timing diagram of waveforms of embodiments of signals for the voltage waveform generation circuit of FIG. 5.

The operation of voltage waveform generation circuit 530 may be more easily understood with reference to FIG. 6. FIG. 6 shows a timing diagram of waveforms of embodiments of signals for the voltage waveform generation circuit 530. FIG. 6 illustrates waveform 671 of power-on reset signal POR, waveform 672 of signal ssen, waveform 673 of reference voltage vip, waveform 674 of voltage Vcmp1, waveform 675 of voltage Vcmp2, waveform 676 of voltage vctl, and waveform 677 of signal slomod. In the embodiment shown, signal ssen is asserted high (logic 1).

Before time=t1, signal POR is high, which forces the NOR3/NOR2 latch into a known state, which leads to: vctl=1, and vip=0V. When ssen is 0 (before time=t2), the NOR3 output is 0, vctl=1, and voltage vip remains at 0V. After signal ssen us asserted at time t2, voltage vctl changes from 1 to 0, causing voltage vip to be slowly charged up by current Ib1. When voltage vip reaches reference voltage vrefm2 at time=t3, comparator output signal cmp2 will switch from 1 to 0. When voltage vip reaches reference voltage vrefp at time=t4, comparator output signal comp1 changes from 0 to 1. This in turn forces voltage vctl to change from 0 to 1, turn transistor M49 on and transistor M32 off, and causes voltage vip to slowly discharge by current source transistor M41. When voltage vip comes down to reference voltage vrefm2 at time=t5, comparator output signal cmp2 changes from 0 to 1, and voltage vctl changes from 1 to 0, which causes voltage vip to slowly ramp up again. The period (per1) of the resulting triangular waveform at voltage vip is:

per1=2(vrefp−vrefm2)*C1/(I2*k2), where k2 is the current mirror ratio M6:M3 in FIG. 5. Since per1 is the spread spectrum modulation period, Fmod may be given by substantially:

Fmod1=1/per1=I2*k2/[2*C1*(vrefp−vrefm2)]

In FIG. 6, this process repeats itself until time=t6, when signal slomod is asserted. The assertion of signal slomod increases the capacitive loading at vip from C1 to C1+C2. As a result, at time t=6, the modulation frequency may be substantially given by:

Fmod2=1/per2=I2*k2/[2*(C1+C2)*(vrefp−vrefm2)]

Modulation frequencies Fmod1, Fmod2 and Fosc are all proportional to the quantity I2/C. Accordingly, the modulation frequency tracks the oscillation frequency.

Figure 7:
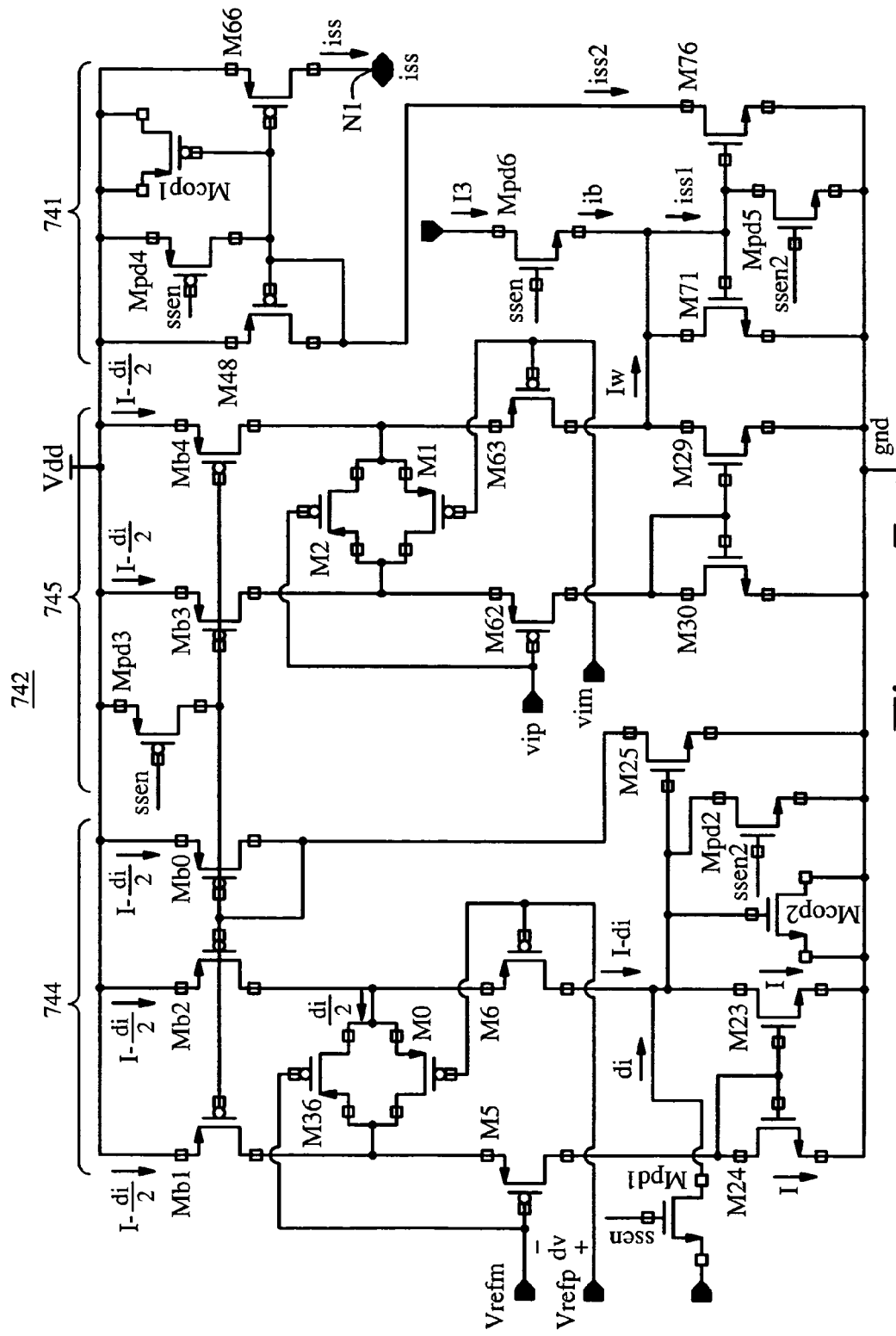
FIG. 7 schematically illustrates an embodiment of the tracking gm block of FIG. 4, arranged in accordance with aspects of the present invention.

FIG. 7 schematically illustrates an embodiment of the tracking gm block 742, which may be employed as an embodiment of tracking gm block 442 of FIG. 4. Components in tracking gm block 742 may be substantially similar to similarly named components in previously described, and may be different in some ways. Tracking gm block 742 includes fixed transconductance stage 744, tracking transconductance stage 745, and scaling circuit 741.

Fixed transconductance stage 744 has a pre-determined input/output relationship. The feedback loop in fixed transconductance stage 744 generates a bias current that complies with the desired gm at transistor Mb0. Tracking transconductance stage 745 substantially duplicates the gm part of the circuit in fixed transconductance stage 744. In one embodiment transistors Mb0-b4 form a substantially one-to-one current mirror. Fixed transconductance stage 744 uses the bias current generated in fixed transconductance stage 744, and its transconductance tracks that of fixed transconductance stage 744.

The gm of fixed transconductance stage 744 is given by di/dv, where dv is a differential reference voltage vrefp−vrefm, and di is an embodiment of current I3. Tracking transconductance stage 745 is arranged to provide current Iw such that current Iw is substantially given by Iw=(vip−vim)*gm.

Fixed transconductance stage 744 is arranged to operate as follows, for an embodiment in which di=5%*I2, and current through M23 and M24 are equal, and herein referred to as I. From Kirchhoff's Current Law, the current through transistor M6 is I−di. Currents through M0 and M36 are di/2, and currents through M25 and Mb0−b2 are substantially the same and equal to I−di/2. Transistors M36 and M0 are arranged to operate as resistive elements which source degenerate the input differential pair M5/M6. Accordingly, fixed transconductance stage 744 has the following transconductance:

gm=di/dt=Iin/(vrefp−vrefm)

or gm=k3*I2/(vrefp−vrefm), where k3 is the current mirror ratio M8:M3 in FIG. 3.

In one embodiment, tracking transconductance stage 745 has the same transconductance value as fixed transconductance stage 744. In one embodiment, voltage vip, which is an embodiment of modulating voltage Vmod, has a slow-moving triangular waveform. If the references are pre-selected such that vrefm=(vrefp+vrefm2)/2, then current Iw has a triangular waveform, with peak-peak current values equal to +/−1 (k3*I2).

In one embodiment, scaling circuit 741 manipulates current Iw such that the resulting modulation current, $I_{SS}$, can be used in very low power oscillator designs. For example, in low power designs, I2 can be a few microamps. If a frequency modulation of about +/−1% is desired, the corresponding modulating is in the order of tens of nA. Current of this order may be too small to be reliably used in fixed transconductance stage 744 (as di). Current scaling allows current $I_{SS}$ to be scaled down as desired without the need to run fixed transconductance stage 744 at extremely low current. In one embodiment, current mirror M71/M76 is a 1-to-1 current mirror, and current mirror M48/M66 is a 4-to-1 current mirror. For this embodiment, current iss1 may be substantially given by iss1=I3+Iw, and current $I_{SS}$ may be substantially given by $I_{SS}$=(I3+Iw)/4.

A Design Example

The following is an example of how the design parameters can be chosen in one embodiment.

Assuming the design specifications are:
Iosc_nominal=4 μA
Fosc_nominal=2 MHz
F_spread=2 MHz+/−1.25%
Fmod=2 kHz (slomod=1), 10 kHz (slomod=0)
The designer may choose the following:
di (of FIG. 7)=5%*I2=0.2 uA
vrefp (of FIG. 7)=750 mV, vrefm (of FIG. 7)=600 mV, vrefm2 (of FIG. 5)=450 V
I3 (of FIG. 7)=20%*I2=0.8 uA
M48-to-M66 ratio (of FIG. 7)=4:1
Ib1=Ib2 (of FIG. 5)=0.5%*I2=20 nA
C1 (of FIG. 5)=3.3 pF, C2=13.2 pF
Accordingly:
gm=di(vrefp−vrefm)=1.33 μmho,
Iw=+/−0.2 uA
iss1=iss2=0.8 uA+/−0.2 uA $I_{SS}$=iss1/4=0.2 uA+/−0.05 uA=5%*I2+/−1.25%*I2
Fmod1=Ib1/[2*(vrefp−vrefm2)*C1]=10 kHz (for slomod=0)
Fmod2=Ib1/[2*(vrefp−vrefm2)*(C1+C2)]=2 kHz (for slomod=1).

Although one embodiment of design parameters has been described for illustrative purposes, the invention is not limited to this example. Many other embodiments are within the scope and spirit of the invention.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. An oscillator circuit, comprising:
a spread-spectrum current generation circuit that is arranged to provide a spread-spectrum current to an oscillator node based, at least in part, on a waveform current, wherein the spread-spectrum current generation circuit includes a current waveform generation circuit that is arranged to provide the waveform current such that the waveform current varies over time as a first waveform that is suitable for spread-spectrum modulation;
a capacitor circuit that is arranged to receive an oscillator current, wherein the capacitor circuit is further arranged to provide a ramp voltage from the oscillator current; and wherein another current is received at the oscillator node such that the oscillator current is a sum of said another current and the spread-spectrum current if the spread-spectrum current generation circuit is enabled;
a comparator circuit that is arranged to compare the ramp voltage with a reference signal, and to provide an oscillator voltage based on the comparison; and
a switch circuit that is arranged to discharge the capacitor circuit if the oscillator voltage corresponds to an asserted level.

2. The oscillator circuit of claim 1, wherein the spread-spectrum current generation circuit is arranged such that the spread-spectrum current generation circuit is enabled if a spread-spectrum enable signal is asserted, and such that the spread-spectrum current generation circuit is disabled if the spread-spectrum enable signal is unasserted.

3. The oscillator circuit of claim 1, wherein the spread-spectrum current generation circuit is configured such that first waveform is a triangle wave.

4. The oscillator circuit of claim 3, wherein the spread-spectrum current generation circuit is arranged such that a frequency of the triangle wave is configurable.

5. An oscillator circuit, comprising:
a spread-spectrum current generation circuit that is arranged to provide a spread-spectrum current based, at least in part, on a waveform current, wherein the spread-spectrum current generation circuit includes a current waveform generation circuit that is arranged to provide the waveform current such that the waveform current varies over time as a first waveform that is suitable for spread-spectrum modulation;
a capacitor circuit that is arranged to receive an oscillator current, wherein the capacitor circuit is further arranged to provide a ramp voltage from the oscillator current; and wherein the oscillator current is based, in part, on the spread-spectrum current if the spread-spectrum current generation circuit is enabled;
a comparator circuit that is arranged to compare the ramp voltage with a reference signal, and to provide an oscillator voltage based on the comparison; and
a switch circuit that is arranged to discharge the capacitor circuit if the oscillator voltage corresponds to an asserted level, wherein
the current waveform generation circuit includes:
a voltage waveform generation circuit that is arranged to provide a modulating voltage;
a fixed transconductance stage that is arranged to have a fixed transconductance; and
a tracking transconductance stage that is arranged to provide the waveform current based on the modulating voltage and a transconductance of the tracking transconductance stage, and further arranged such that the transconductance of the tracking transconductance stage is substantially the same as the transconductance of the fixed transconductance stage.

6. An oscillator circuit, comprising:
a spread-spectrum current generation circuit that is arranged to provide a spread-spectrum current based, at least in part, on a waveform current, wherein the spread-spectrum current generation circuit includes a current waveform generation circuit that is arranged to provide the waveform current such that the waveform current varies over time as a first waveform that is suitable for spread-spectrum modulation;
a capacitor circuit that is arranged to receive an oscillator current, wherein the capacitor circuit is further arranged to provide a ramp voltage from the oscillator current; and wherein the oscillator current is based, in part, on the spread-spectrum current if the spread-spectrum current generation circuit is enabled;
a comparator circuit that is arranged to compare the ramp voltage with a reference signal, and to provide an oscillator voltage based on the comparison;
a switch circuit that is arranged to discharge the capacitor circuit if the oscillator voltage corresponds to an asserted level;
a voltage reference circuit;
an op amp that is coupled to the voltage reference circuit;
an impedance circuit that is coupled to the op amp and arranged to provide a mirror input current that is substantially constant; and
a current mirror circuit that is arranged to receive the mirror input current, and to provide, at a first node, a first mirror output current based on the mirror input current, wherein the capacitor circuit is coupled to the first node, the comparator circuit includes an input that is coupled to the first node, and wherein the spread-spectrum current generation circuit is arranged to provide the spread-spectrum current to the first node if the spread-spectrum current generation circuit is enabled.

7. The oscillator circuit of claim 6, wherein the current mirror circuit is further configured to provide another mirror output current to the first node if the spread-spectrum current generation circuit is disabled.

8. The oscillator circuit of claim 6, wherein
the voltage reference circuit is arranged to provide a first reference voltage to the op amp, and further arranged to provide a differential reference voltage;
the current mirror circuit is arranged to provide second and third mirror output currents based on the mirror input current; and
wherein the current waveform generation circuit includes:
a voltage waveform generation circuit that is arranged to provide a modulating voltage;

a fixed transconductance stage that is arranged to have a fixed transconductance based on the differential reference voltage and the second mirror output current; and a tracking transconductance stage that is arranged to provide the waveform current based on the modulating voltage and a transconductance of the tracking transconductance stage, and further arranged such that the transconductance of the tracking transconductance stage is substantially the same as the transconductance of the fixed transconductance stage.

9. The oscillator circuit of claim 8, further comprising a scaling circuit that is arranged to provide the spread-spectrum current based on the waveform current by: combining the third mirror output current with the waveform current to provide an intermediate current, and scaling the intermediate current to provide the spread-spectrum current.

10. A switched power converter controller, comprising:
an error amplifier; and
a pulse width modulation circuit that is coupled to the error amplifier, wherein the pulse width modulation circuit includes a spread-spectrum oscillator circuit, wherein the spread-spectrum oscillator circuit is arranged to provide an oscillator current such that at least a portion of the oscillator current is modulated, and further arranged to provide an oscillator voltage based, in part, on the oscillator current by providing the oscillator current to a first capacitor such that the oscillator voltage is a spread-spectrum signal.

11. The switched power converter controller of claim 10, further comprising:
a voltage divider that is arranged to provide a feedback voltage that is based, in part, on an output voltage, wherein the error amplifier includes first and second inputs and an output; the error amplifier is arranged to receive the feedback voltage at the first input of the error amplifier, to receive a reference voltage at the second input of the error amplifier, and to provide an error signal at the output of the error amplifier; and wherein the pulse width modulation circuit is configured to provide a pulse width modulation output signal such that a duty cycle of the pulse width modulation output signal is modulated based on the error signal.

12. The switched power converter controller of claim 10, wherein the spread-spectrum oscillator circuit includes:
a spread-spectrum current generation circuit that is arranged to provide a spread-spectrum current based on a waveform current, wherein the spread-spectrum current generation circuit includes a current waveform generation circuit that is arranged to provide the waveform current such that the waveform current varies over time as a first waveform that is suitable for spread-spectrum modulation.

13. A switched power converter controller, comprising:
an error amplifier; and
a pulse width modulation circuit that is coupled to the error amplifier, wherein the pulse width modulation circuit includes a spread-spectrum oscillator circuit, wherein the spread-spectrum oscillator circuit is arranged to provide an oscillator current such that at least a portion of the oscillator current is modulated, and further arranged to provide an oscillator voltage based, in part, on the oscillator current such that the oscillator voltage is a spread-spectrum signal, wherein the spread-spectrum oscillator circuit includes:
a spread-spectrum current generation circuit that is arranged to provide a spread-spectrum current based on a waveform current, wherein the spread-spectrum current generation circuit includes a current waveform generation circuit that is arranged to provide the waveform current such that the waveform current varies over time as a first waveform that is suitable for spread-spectrum modulation;
a capacitor circuit that is arranged to provide a ramp voltage from an oscillator current, wherein the spread-spectrum oscillator circuit is arranged such that the oscillator current is based, in part, on the waveform current; and such that the oscillator current is based, in part, on the spread-spectrum current if the spread-spectrum current generation circuit is enabled;
a comparator circuit that is arranged to compare the ramp voltage with a reference signal, and to provide the oscillator voltage based on the comparison; and
a switch that is arranged to discharge the capacitor circuit if the oscillator voltage corresponds to an asserted level.

14. The switched power converter controller of claim 10, wherein
the switched power converter controller is arranged to operate in conjunction with at least a power switch and an output LC filter, and wherein the first capacitor is not part of the output LC filter.

15. A method for oscillation, comprising:
providing an oscillator current such that at least a portion of the oscillator current is modulated;
providing a ramp voltage by providing the oscillator current to a capacitor circuit; and
providing an oscillator voltage based, in part, on the oscillator current such that the oscillator voltage is a spread-spectrum signal, wherein providing the oscillator current includes:
providing a waveform current such that the waveform current varies over time as a first waveform that is suitable for spread-spectrum modulation;
providing a spread-spectrum current based on the waveform current; and
providing the oscillator current by combining the spread-spectrum current with another current.

16. The method of claim 15, wherein providing the oscillator voltage is accomplished by:
comparing the ramp voltage with a reference voltage.

17. The method of claim 15, wherein the first waveform is a triangle wave.

18. The method of claim 15, wherein providing the oscillator current further includes:
generating a reference current; and
providing the reference current to a current mirror to provide a plurality of mirror output currents, wherein said another current is one of the plurality of mirror output currents.

19. The method of claim 18, wherein providing the waveform current includes:
generating a modulating voltage;
providing another of the plurality of mirror output currents to a fixed transconductance stage to provide a bias current; and
providing the waveform current by mirroring the bias current to a tracking transconductance stage and providing the modulating voltage to the tracking transconductance stage.

20. The method of claim 18, wherein providing the spread-spectrum current based on the waveform current includes:
combining another of the plurality of mirror output currents with the waveform current to provide an intermediate current; and scaling the intermediate current to provide the spread-spectrum current.

21. An oscillator circuit, comprising:
a spread-spectrum current generation circuit that is arranged to provide a spread-spectrum current based, at least in part, on a waveform current, wherein the spread-spectrum current generation circuit includes a current waveform generation circuit that is arranged to provide the waveform current such that the waveform current varies over time as a first waveform that is suitable for spread-spectrum modulation;
a capacitor circuit that is arranged to receive an oscillator current, wherein the capacitor circuit is further arranged to provide a ramp voltage from the oscillator current; and wherein the oscillator current is based, in part, on the spread-spectrum current if the spread-spectrum current generation circuit is enabled;
a comparator circuit that is arranged to compare the ramp voltage with a reference signal, and to provide an oscillator voltage based on the comparison; and
a switch circuit that is arranged to discharge the capacitor circuit to substantially no charge if the oscillator voltage corresponds to an asserted level.

* * * * *

UNITED STATES PATENT AND TRADEMARK OFFICE
CERTIFICATE OF CORRECTION

PATENT NO. : 7,423,494 B1
APPLICATION NO. : 11/030681
DATED : September 9, 2008
INVENTOR(S) : Jane Xin-LeBlanc Page 1 of 1

It is certified that error appears in the above-identified patent and that said Letters Patent is hereby corrected as shown below:

In column 1, line 65, delete "froth" and insert -- forth --, therefor.

In column 4, line 25, delete "ssenz" and insert -- ssen --, therefor.

In column 4, line 46, delete "ISS" and insert -- $I_{SS}$ --, therefor.

In column 6, line 31, delete "+/31" and insert -- +/- --, therefor.

In column 6, line 36, delete "+/31 1%" and insert -- +/- 1% --, therefor.

Signed and Sealed this

Thirteenth Day of January, 2009

JON W. DUDAS
*Director of the United States Patent and Trademark Office*